(12) United States Patent
Deng et al.

(10) Patent No.: US 11,024,562 B2
(45) Date of Patent: Jun. 1, 2021

(54) LEAD FRAME SYSTEM

(71) Applicant: Texas Instruments Incorporated, Dallas, TX (US)

(72) Inventors: Xingliang Deng, Sichuan (CN); Minhui Ma, Sichuan (CN); Qinghua Hu, Sichuan (CN); Alex Ting Chin-Sern, Johor (MY); Ruben Da Rolda, Jr., Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/296,880

(22) Filed: Oct. 18, 2016

(65) Prior Publication Data

US 2017/0309546 A1 Oct. 26, 2017

Related U.S. Application Data

(63) Continuation of application No. PCT/CN2016/079981, filed on Apr. 22, 2016.

(51) Int. Cl.
*H01L 23/495* (2006.01)
*H01L 23/544* (2006.01)

(52) U.S. Cl.
CPC ...... *H01L 23/4951* (2013.01); *H01L 23/4952* (2013.01); *H01L 23/49541* (2013.01); *H01L 23/49579* (2013.01); *H01L 23/544* (2013.01); *H01L 2223/54453* (2013.01); *H01L 2224/48247* (2013.01); *H01L 2224/48464* (2013.01); *H01L 2224/49171* (2013.01); *H01L 2224/73265* (2013.01); *H01L 2224/97* (2013.01)

(58) Field of Classification Search
CPC ..... H01L 23/49; H01L 23/54; H01L 23/4951; H01L 23/4952; H01L 23/49541; H01L 23/49579; H01L 23/544; H01L 21/6836; H01L 2223/54453; H01L 2224/48247; H01L 2224/48464; H01L 2224/49171; H01L 2224/73265; H01L 2224/97
USPC .............. 257/666–670, 675, 676, E23.037, 257/E23.039, E3.04, E21.502; 438/112, 438/123
See application file for complete search history.

(56) References Cited

U.S. PATENT DOCUMENTS

| | | | | |
|---|---|---|---|---|
| 6,316,822 B1 * | 11/2001 | Venkateshwaran | ......................... H01L 23/49575 | 257/666 |
| 6,400,004 B1 * | 6/2002 | Fan | ..................... H01L 23/3107 | 257/666 |
| 6,608,366 B1 * | 8/2003 | Fogelson | .............. H01L 21/561 | 257/666 |
| 6,885,086 B1 * | 4/2005 | Fogelson | .......... H01L 23/49541 | 257/666 |
| 7,008,825 B1 * | 3/2006 | Bancod | .............. G01R 31/2896 | 257/666 |

(Continued)

FOREIGN PATENT DOCUMENTS

CN 102237280 A 11/2011

*Primary Examiner* — Armando Rodriguez
(74) *Attorney, Agent, or Firm* — Dawn Jos; Charles A. Brill; Frank D. Cimino

(57) ABSTRACT

A lead frame strip with corrugated saw street metal where the corrugated saw street metal is comprised of a partial thickness of the lead frame strip metal. A lead frame strip with corrugated saw street metal where the corrugated saw street metal is comprised of a half thickness of the lead frame strip metal.

21 Claims, 7 Drawing Sheets

(56) References Cited

U.S. PATENT DOCUMENTS

| | | | |
|---|---|---|---|
| 7,049,177 B1* | 5/2006 | Fan | H01L 21/4832 257/676 |
| 7,943,431 B2* | 5/2011 | San Antonio | H01L 21/561 438/123 |
| 2005/0093117 A1* | 5/2005 | Masuda | H01L 21/565 257/676 |
| 2005/0287709 A1* | 12/2005 | Lee | H01L 21/56 438/122 |
| 2006/0199308 A1* | 9/2006 | Lee | H01L 21/4828 438/110 |
| 2007/0001278 A1* | 1/2007 | Jeon | H01L 21/561 257/676 |
| 2007/0126092 A1* | 6/2007 | San Antonio | H01L 21/561 257/674 |
| 2007/0273017 A1* | 11/2007 | Maloney | H01L 23/3107 257/690 |
| 2008/0258278 A1* | 10/2008 | Ramos | H01L 23/49582 257/676 |
| 2009/0127684 A1* | 5/2009 | Kuo | H01L 21/561 257/676 |
| 2009/0160039 A1* | 6/2009 | Wong | H01L 23/3107 257/673 |
| 2009/0160067 A1* | 6/2009 | Bayan | H01L 23/49541 257/778 |
| 2009/0194854 A1* | 8/2009 | Tan | H01L 23/49548 257/666 |
| 2009/0230523 A1* | 9/2009 | Chien | H01L 21/4832 257/676 |
| 2009/0230525 A1* | 9/2009 | Chang Chien | H01L 21/4832 257/676 |
| 2010/0133693 A1* | 6/2010 | Arshad | H01L 24/97 257/762 |
| 2011/0079886 A1* | 4/2011 | Bathan | H01L 21/4832 257/676 |
| 2011/0104854 A1* | 5/2011 | Wong | H01L 23/3107 438/113 |
| 2011/0244629 A1* | 10/2011 | Gong | H01L 21/4828 438/112 |
| 2012/0139104 A1* | 6/2012 | Camacho | H01L 21/4832 257/737 |
| 2012/0205811 A1* | 8/2012 | Do | H01L 21/4832 257/773 |
| 2012/0252142 A1* | 10/2012 | Abbott | H01L 21/561 438/15 |
| 2012/0280390 A1* | 11/2012 | Do | H01L 21/4832 257/738 |
| 2012/0280407 A1* | 11/2012 | Do | H01L 21/4832 257/778 |
| 2013/0134567 A1* | 5/2013 | Tan | H01L 23/4951 257/666 |
| 2014/0001616 A1* | 1/2014 | Daniels | H01L 24/97 257/676 |
| 2014/0035113 A1* | 2/2014 | Kierse | H01L 21/4832 257/676 |
| 2014/0127861 A1* | 5/2014 | Fernando | H01L 24/97 438/112 |
| 2015/0001698 A1* | 1/2015 | Jaurigue | H01L 24/96 257/676 |
| 2016/0148876 A1* | 5/2016 | Kitnarong | H01L 24/83 257/666 |
| 2016/0254214 A1* | 9/2016 | Makino | H01L 24/97 257/676 |
| 2016/0307826 A1* | 10/2016 | McKnight-MacNeil | H01L 29/2003 |
| 2017/0133302 A1* | 5/2017 | Truhitte | H01L 23/49541 |

* cited by examiner

LEAD FRAME SYSTEM

FIELD

This disclosure relates to the field of integrated circuit packaging. More particularly, this disclosure relates lead frames.

BACKGROUND

Lead frame strips made primarily of copper or a copper alloy are typically provided for semiconductor devices in order to provide a stable support for firmly positioning an integrated circuit (IC) chip within a package, and to electrically connect the IC chip to various other components via a circuit board. Lead frames vary in size. The size of the lead frame is commonly dependent upon the size of the IC chip and the number of connections that are made to the IC chip. The number of connections may vary from a few to over a hundred.

As is illustrated in FIG. 1, the lead frame strip 100 may be comprised of multiple lead frames 101 connected together by saw streets 110.

As is illustrated in FIG. 2A the lead frames 201 are typically comprised of a plurality of wirebond pads 102 that are electrically isolated from each other and electrically isolated from a centrally located IC chip pad 104. The IC chip pad 104 provides a surface on which the IC chip 202 (FIG. 2B) may be mounted. The wirebond pads 102 are typically connected to the saw scribes 110 with tie bars 108. Wire bonds 206 (FIGS. 2B and 2C) are typically used to electrically connect individual bond pads on the IC chip 202 to individual wirebond pads 102. The illustrative example in FIG. 2A has four wirebonds 102 but the lead frame 201 may have any number of wirebond pads 102. Some lead frames 201 have over one hundred wirebond pads 102.

An alternative lead frame 301 is illustrated in FIG. 3A. This lead frame 301 is commonly referred to as a chip on lead (COL) lead frame. As shown in FIG. 3A, the COL has no IC chip pad 104. The COL has only wirebond pads 102. As is illustrated in the top down view of FIG. 3B and the cross section in FIG. 3C, the IC chip 302 is mounted on top of the edges of at least two of the wirebond pads 102. A support 304 that is not electrically conductive provides support for the IC chip 302 and also electrically isolates the IC chip 302 from the edges of the wirebond pads 102.

The saw streets 110 and tie bars 108 are typically comprised of thin metal strips between the lead frames 101. The saw streets 110 support the lead frames 101 during die attach (IC chip attachment to the lead frame), wire bonding (wire connecting IC bond pads to wirebond pads), and potting (encapsulation of the IC chip, wire bonds, and lead frames 101 with molding compound). Sawing along the saw streets 110 is then used to separate the individual packaged IC chips.

FIGS. 4A, 4B, 4C, 4D, and 4E illustrate a lead frame for an IC chip 201 with four bondwire pads 102.

FIG. 4A is a top down view of the lead frame 400. The example lead frame 400 accommodates the attachment of four IC chips 400 to four centrally located IC chip pads 104. In this illustrative example, there is one wirebond pad 102 on each side of the IC chip pad 104. The wirebond pads 102 are separated from the IC chip pad 104 by slotted openings 106 in the lead frame. The IC chip pads 104 and the wirebond pads 102 are formed with a full thickness of lead frame metal. The saw lanes 110 and tie bars 108 which connect the IC chip pads 104 and the wirebond pads 102 to the saw streets 110 are typically formed with a partial thickness of lead frame metal (typically a half thickness.)

As shown in the cross section taken along cut line 424 in FIG. 4A, the full thickness IC chip pads 104 are attached on the bottom side to lead frame support tape 112. The half thickness tie bars 108 which connect the IC chip pads 104 to the saw scribe 110 are separated from the lead frame support tape 112 by voids 114.

As shown in the cross section taken along cut line 422 in FIG. 4A, the full thickness wirebond pads 102 are attached on the bottom side to lead frame support tape 112. The half thickness tie bars 108 which connect the wirebond pads 102 to the saw street 110 are separated from the lead frame support tape 112 by voids 114.

As shown in the cross section taken along cut line 420 in FIG. 4A, the full thickness wirebond pads 102 are attached on the bottom side to lead frame support tape 112. The half thickness saw streets 110 are separated from the lead frame tape 112 by voids 114.

As shown in the cross section taken along cut line 426 in FIG. 4A, the half thickness saw streets 110 are separated from the lead frame support tape 112 by voids 114.

The plan view of the lead frame in FIG. 5A shows the lead frame material that is removed by sawing along the horizontal saw streets 504 and along the vertical saw streets 502 to separate the packaged die 520 as shown in FIGS. 5B, 5C, and 5D.

FIG. 5C is a cross section through one of the packaged die 520. The cross section is through the centrally located IC chip pad 104 and two of the wirebond pads 102. The IC chip (die) 202 is mounted on the centrally located IC chip pad 104. Wire bonds 206 electrically connect bond pads on the IC chip 202 to the wirebond pads 102.

After the IC chip 202 is mounted on the IC chip pad 104 and connected to the wirebond pads 102 with wire bonds 206, the lead frame 201, IC chip 202, wirebond pads 102, and wire bonds 206 are encapsulated in a molding compound 508 to provide mechanical stability and protection from the environment. The first lead frame support tape is then removed from the bottom of the lead frame 400 and a second lead frame support tape 512 is applied to the top surface of the molding compound 508.

The molding compound 508, the half thickness saw street 110 metal, and the half thickness tie bar 108 metal sawed from the scribe streets 502 and 504, to separate the packaged die 520 as shown in FIG. 5C.

FIG. 5D shows a cross section of two packaged die 520 taken along cut line 516 in FIG. 5B through two of the wirebond pads 102. The packaged die 520 are attached to the second lead frame tape 512.

FIG. 5E shows a cross section of two packaged die 520 taken along cut line 518 through the centrally located IC chip pad 104 and attached IC chip 202. The packaged die 520 are attached to the second lead frame tape 512.

FIG. 5F shows a cross section taken along cut line 522 in FIG. 5B through a saw street, 502 and 504 after sawing. As is shown all molding compound 508, half thickness saw scribe metal 110 and half thickness tie bar metal 108 are removed by sawing. Only the second lead frame support tape 512 remains in the saw scribe, 502 and 504, areas after sawing.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A lead frame strip with corrugated saw street metal where the corrugated saw street metal is comprised of a partial thickness of the lead frame strip metal. A lead frame strip with corrugated saw street metal where the corrugated saw street metal is comprised of a half thickness of the lead frame strip metal.

DETAILED DESCRIPTION OF EXAMPLE EMBODIMENTS

Embodiments of the disclosure are described with reference to the attached figures. The figures are not drawn to scale and they are provided merely to illustrate the disclosure. Several aspects of the embodiments are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The embodiments are not limited by the illustrated ordering of acts or events, as some acts may occur in different orders and/or concurrently with other acts or events. Furthermore, not all illustrated acts or events are required to implement a methodology in accordance with the present disclosure.

Figure 1:
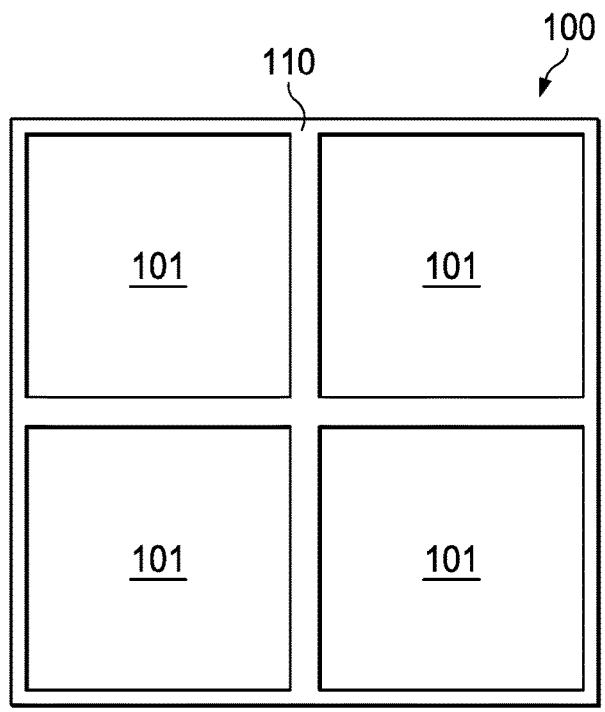
FIG. 1 (Prior art) is a plan view of a lead frame strip.
Figure 2A:
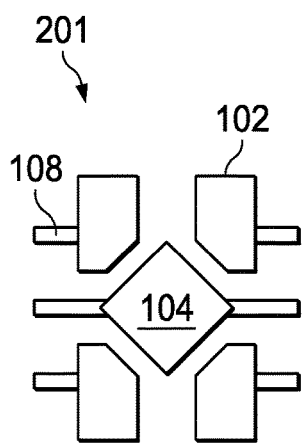
FIGS. 2A and 2B (Prior art) are a plan view of a lead frame and an IC chip pad with 4 package leads mounted on the lead frame.
Figure 2B:
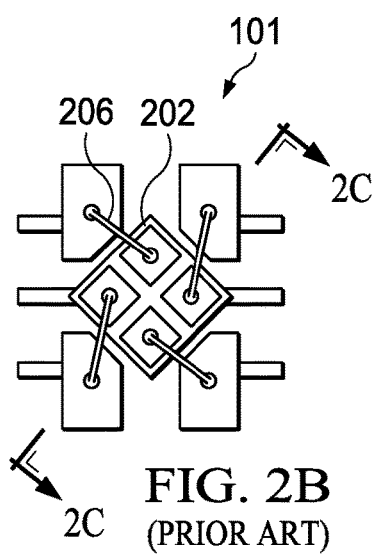
Figure 2C:
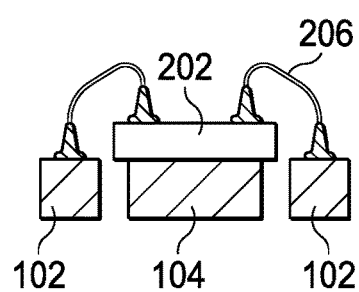
FIG. 2C (prior art) is a cross section along the cut line in the plan view in FIG. 2B.
Figure 3A:
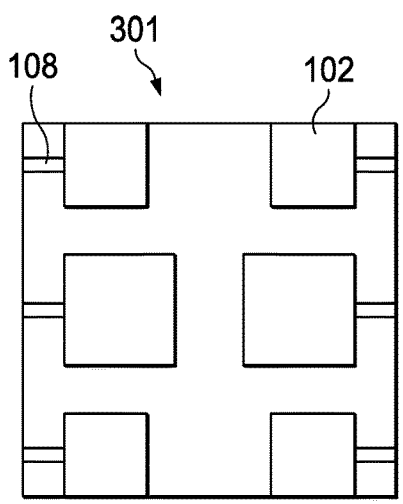
FIGS. 3A and 3B (Prior art) are a plan view of chip on lead IC package with 6 package leads.
Figure 3B:
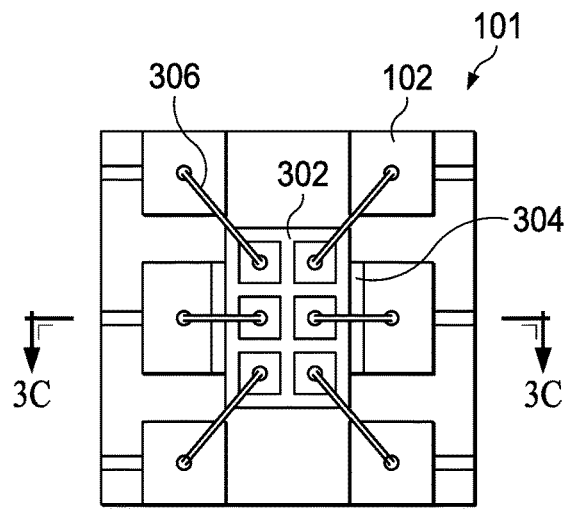
Figure 3C:
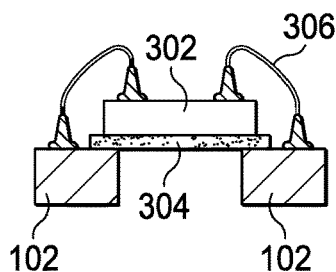
FIG. 3C (prior art) is a cross section along the cut line in the plan view in FIG. 3B.
Figure 4A:
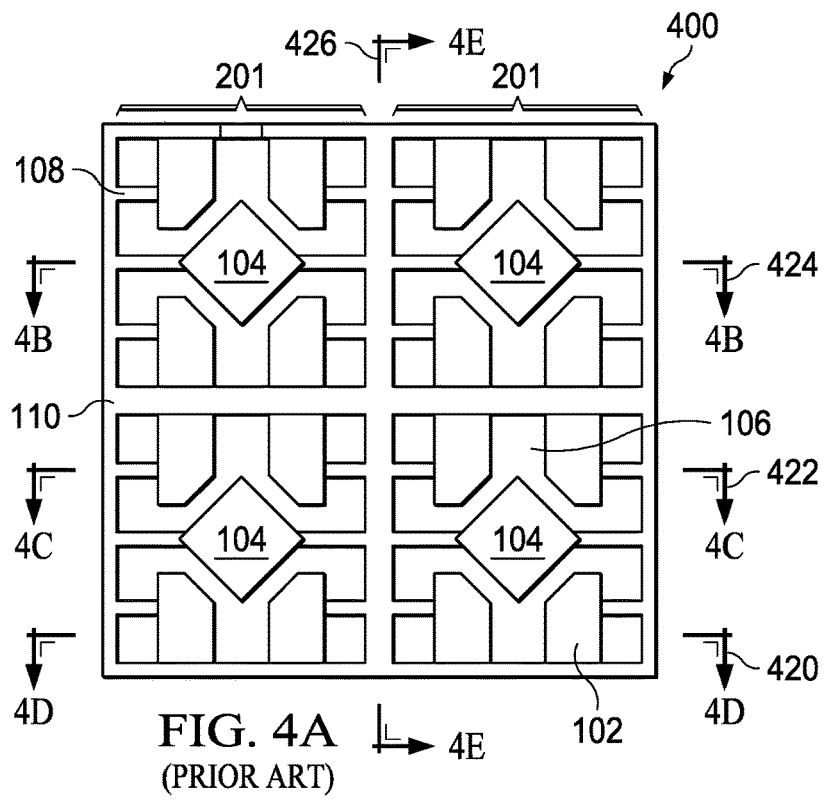
FIG. 4A (Prior art) is a plan view of a lead frame strip with 4 lead frames.
Figure 4B:
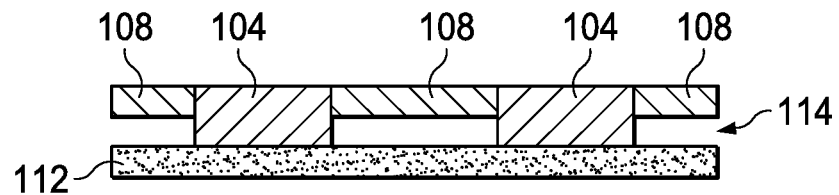
FIGS. 4B, 4C, 4D and 4E (Prior Art) are cross sections along cut lines in the plan view in FIG. 4A.
Figure 4C:
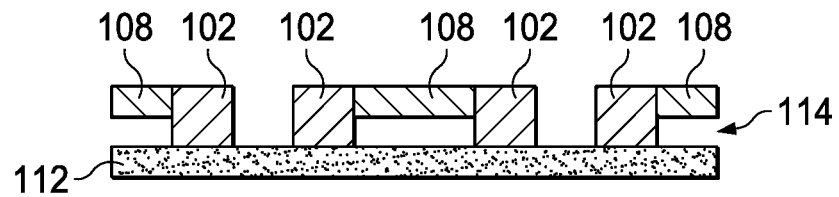
Figure 4D:
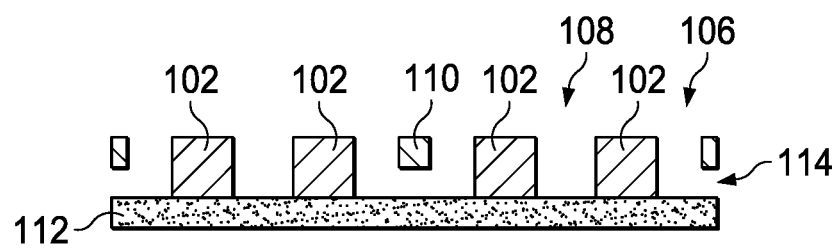
Figure 4E:
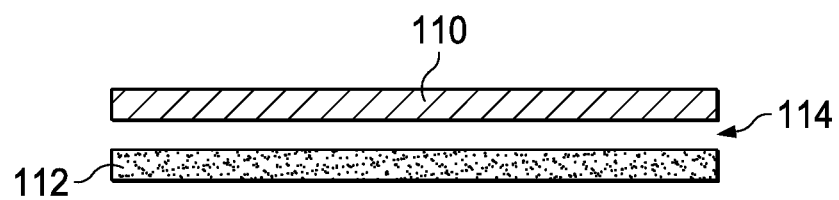
Figure 5A:
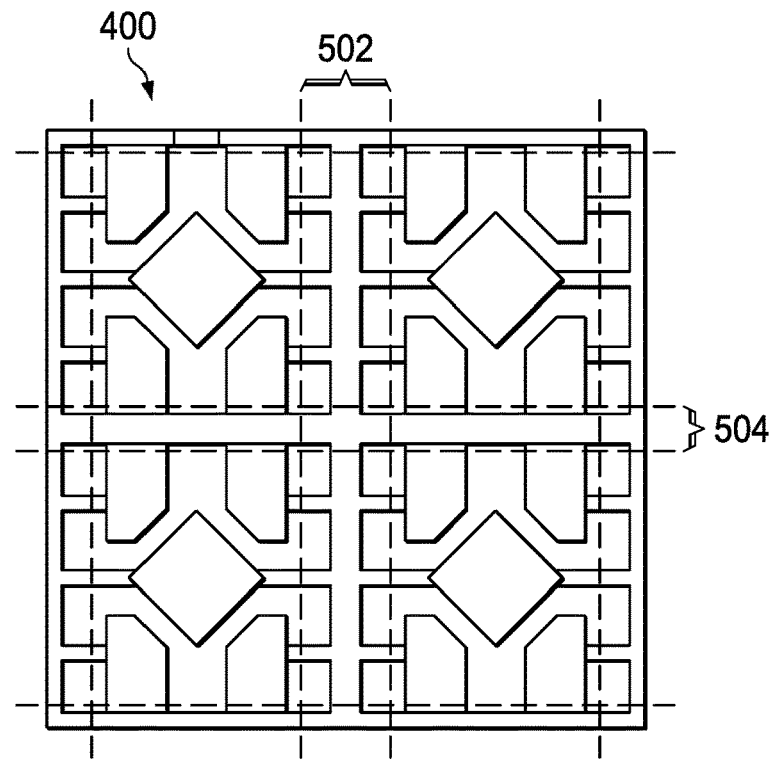
FIG. 5A (Prior art) is a plan view of a lead frame strip with 4 lead frames.
Figure 5B:
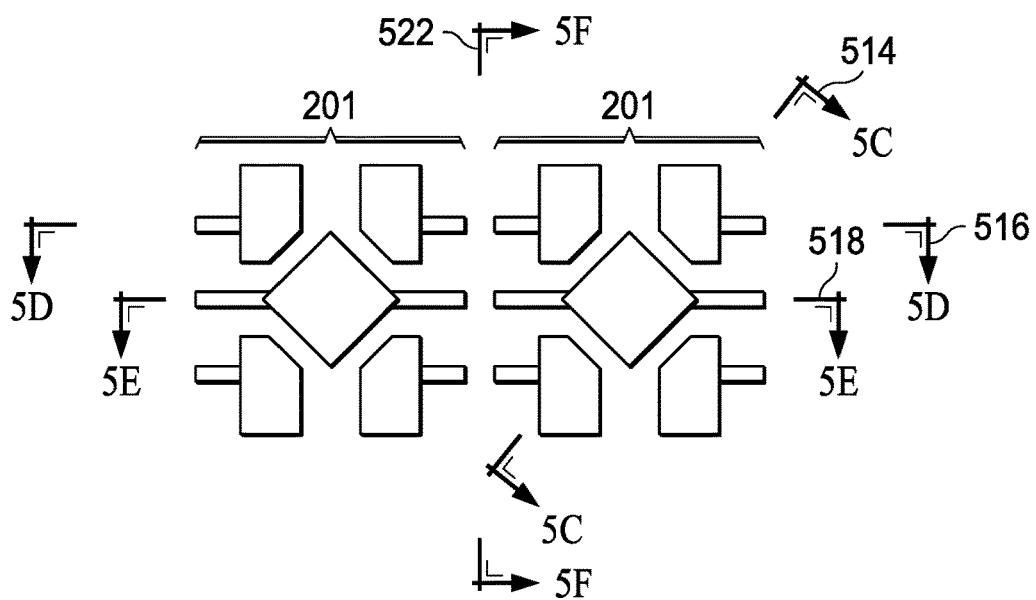
FIG. 5B (Prior art) is a plan view of two lead frames that are separated by sawing along the saw streets of FIG. 5A.
Figure 5C:
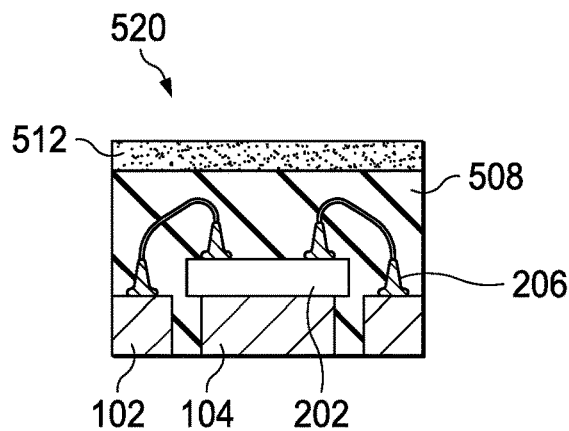
FIGS. 5C, 5D, 5E, and 5F (Prior Art) are cross sections along cut lines in the plan view in FIG. 5B.
Figure 5D:
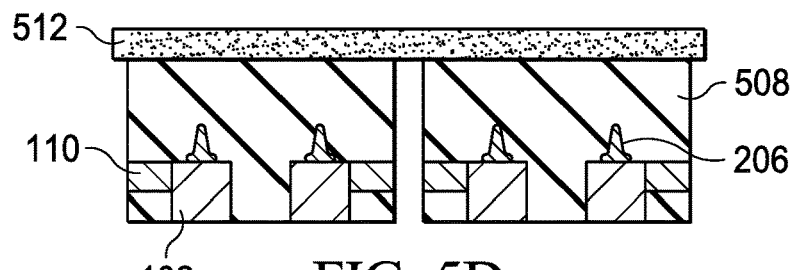
Figure 5E:
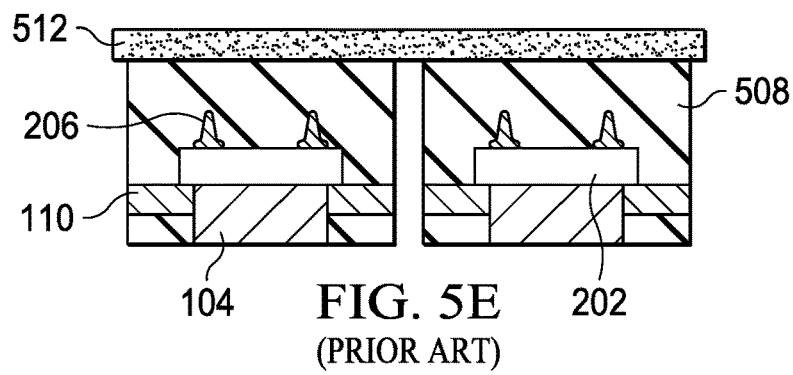
Figure 5F:
Figure 6:
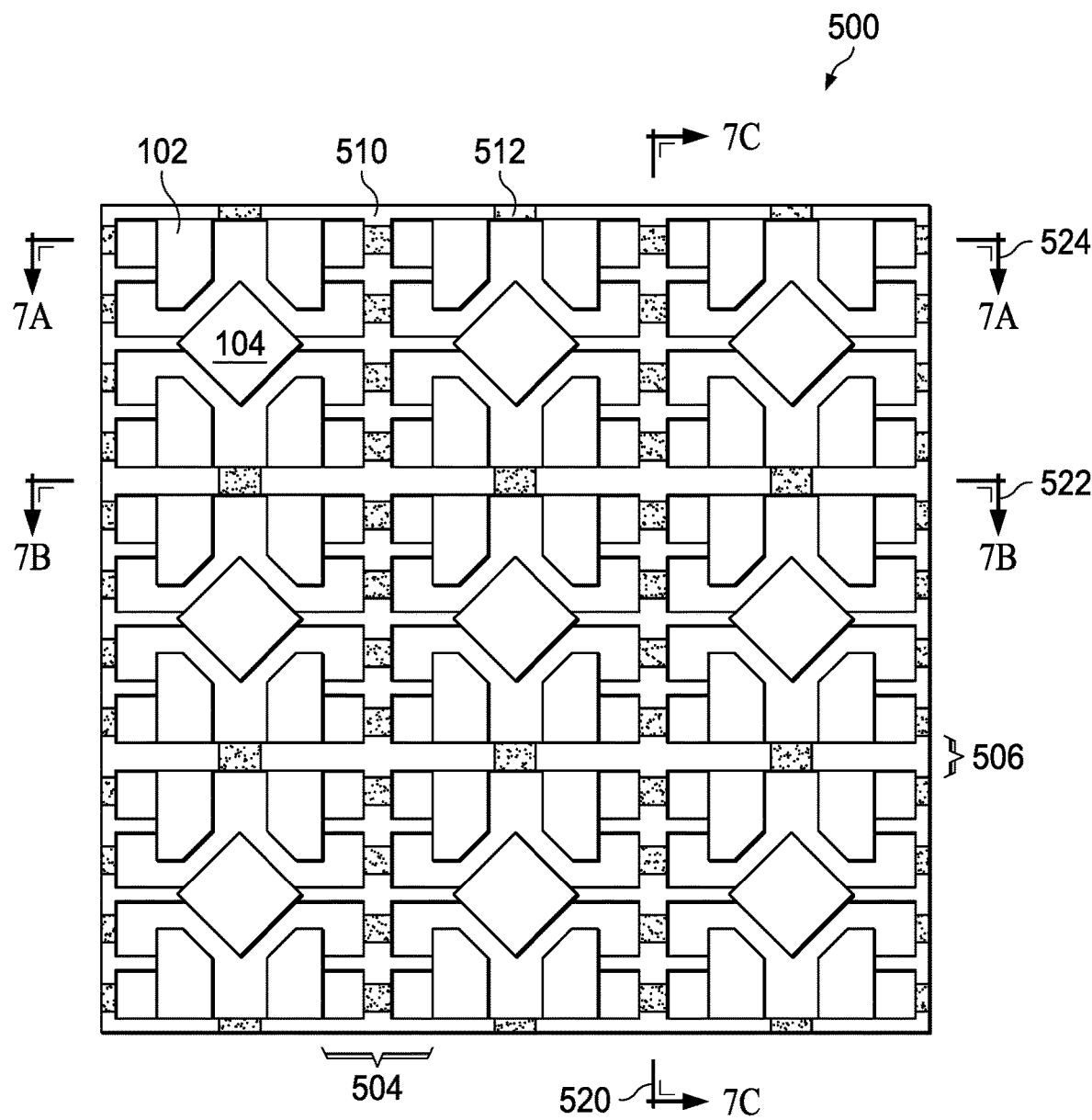
FIG. 6 is a plan view of a lead frame strip with 9 lead frames and with embodiment corrugated saw streets.
Figure 7A:
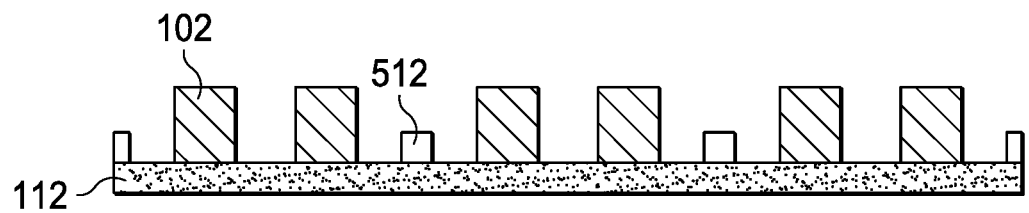
FIGS. 7A, 7B, and 7C are cross sections along cut lines through embodiment saw streets in the plan view in FIG. 6.

An example improved lead frame strip 500 is illustrated in FIGS. 6 and 7. The portion of a lead frame strip 500 shown in FIG. 6 consists of 9 lead frames connected together by half thickness metal vertical saw streets 504 and half thickness metal horizontal saw streets 506. A plurality of tie bars extend horizontally from wire bond pads 102 or the IC chip pad 104 and connects the wire bond pads 102 or the IC chip pad 104 to the half thickness metal vertical saw streets 504 as shown in FIG. 6.

Figure 7B:
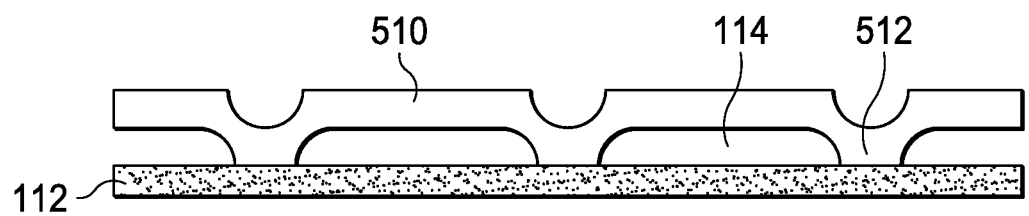
Figure 7C:
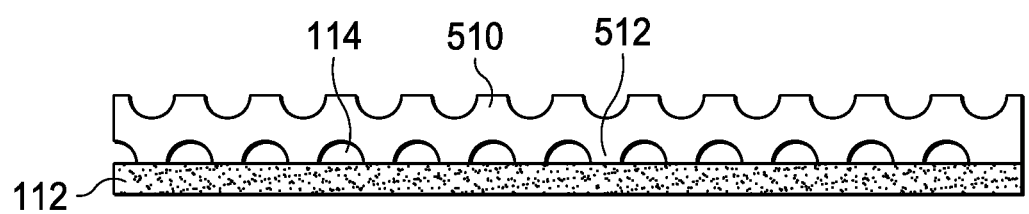

As shown in the cross section FIG. 7B taken along cut line 522 through a horizontal corrugated saw street 506 in FIG. 6A and FIG. 7C taken along cut line 520 through a vertical corrugated saw street 504, the half thickness metal in the corrugated saw streets, 504 and 506, have corrugations so that a portion of the half thickness metal in the corrugated scribe streets, 504 and 506, is attached to lead frame support tape 112. As shown in FIG. 7B, the horizontal corrugated saw streets includes a U shaped groove on top and a second groove on the bottom of the saw street. As shown in FIG. 7C, the vertical corrugated saw streets includes a U shaped groove on top and another U shaped groove on the bottom of the saw street. First portions 510 of the embodiment half thickness metal corrugated saw streets, 504 and 506, are separated from the first lead frame support tape 112 by voids 114 (alternatively referred to as grooves) and second portions 512 of the embodiment half thickness metal corrugated saw streets, 504 and 506 are attached to the surface of the first lead frame support tape 112. Corrugation of the half thickness metal saw streets, 504 and 506, substantially improves the mechanical stability of the lead frame during wire bonding and during molding compound injection. The added strength of the lead frame improves yield by reducing the number of ball bonds that delaminate from the bond pads on the chip or that delaminate from the package leads due to stress caused when the lead frame flexes.

The corrugation of the half thickness metal in the saw streets, 504 and 506, adds significant strength and rigidity to the corrugated saw streets, 504 and 506, with little increase in the amount of metal used to manufacture the lead frame strip 600 and with little increase in the amount of metal that is sawed through when separating the packaged die. This keeps the cost of the lead frame manufacture and also avoids excessive wear and replacement of saw blades.

The embodiments are illustrated using lead frames with four wirebond pads. The idea is generic and may be used to improve lead frame strips with lead frames with any number of wire bond pads.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A lead frame strip comprising:
   at least two lead frames; and
   a corrugated saw street connecting the at least two lead frames, the corrugated saw street including U shaped grooves on both a first surface and an opposite second surface,
   wherein the U shaped grooves on the first surface and the U shaped grooves on the second surface do not align with each other in a vertical direction, the vertical direction being perpendicular to a plane along a length of the lead frame strip.

2. The lead frame strip of claim 1, wherein each of the at least two lead frames includes an integrated circuit (IC) chip pad for attachment of an IC die.

3. The lead frame strip of claim 2, wherein each of the at least two lead frames include a plurality of wire bond pads.

4. The lead frame strip of claim 1, further comprising a lead frame strip support tape, wherein the opposite second surface is attached to the lead frame strip support tape.

5. The lead frame strip of claim 1, wherein the lead frame strip includes copper or a copper alloy.

6. The lead frame strip of claim 1, wherein the U shaped grooves are evenly spaced from each other on the first surface and the opposite second surface.

7. The lead frame strip of claim 1, wherein each of the U shaped grooves on the first surface includes an opening that is coplanar with a plane of the first surface, and each of the U shaped grooves on the second surface includes an opening that is coplanar with a plane of the second surface.

8. A lead frame strip comprising:
at least two lead frames; and
a corrugated saw street connecting the at least two lead frames, the corrugated saw street including U shaped grooves on both a first surface and an opposite second surface,
wherein each of the at least two lead frames includes an integrated circuit (IC) chip pad for attachment of an IC die,
wherein the IC chip pad is connected to the saw street via a tie bar.

9. A lead frame strip comprising:
at least two lead frames; and
a corrugated saw street connecting the at least two lead frames, the corrugated saw street including a first groove on a first surface and a second groove on an opposite second surface, the first groove being U shaped,
wherein the first groove on the first surface and the second groove on the second surface do not align with each other in a vertical direction, the vertical direction being perpendicular to a plane along a length of the lead frame strip.

10. The lead frame strip of claim 9, wherein the corrugated saw street includes a plurality of first grooves on the first surface and a plurality of second grooves on the opposite second surface.

11. The lead frame strip of claim 10,
wherein the first groove has a first opening and the second groove has a second opening, the first opening being coplanar with a plane of the first surface and the second opening being coplanar with a plane of the opposite second surface,
wherein the second opening has a length equal to a distance between two adjacent ends of two adjacent first grooves of the plurality of first grooves.

12. The lead frame strip of claim 9, wherein the lead frame strip includes copper or a copper alloy.

13. The lead frame strip of claim 10, wherein adjacent ones of the plurality of first grooves are evenly spaced and adjacent ones of the plurality of second grooves are evenly spaced.

14. A lead frame strip comprising:
at least two lead frames; and
a corrugated saw street connecting the at least two lead frames, the corrugated saw street including a first groove on a first surface and a second groove on an opposite second surface, the first groove being U shaped,
wherein the first groove has a first opening and the second groove has a second opening, the first opening being coplanar with a plane of the first surface and the second opening being coplanar with a plane of the opposite second surface, and wherein the second opening is larger than the first opening.

15. The lead frame strip of claim 14, wherein the corrugated saw street includes a plurality of first grooves on the first surface and a plurality of second grooves on the opposite second surface.

16. The lead frame strip of claim 15, wherein adjacent ones of the plurality of first grooves are evenly spaced and adjacent ones of the plurality of second grooves are evenly spaced.

17. A lead frame strip comprising:
at least two lead frames, each of the at least two lead frames including an integrated circuit (IC) chip pad for attachment of an IC die, and a plurality of leads adjacent to the IC chip pad; and
a corrugated saw street connecting the at least two lead frames, the corrugated saw street including a first plurality of grooves on a first surface and a second plurality of grooves on an opposite second surface, wherein a first plurality of tie bars connects the IC chip pad to the corrugated saw street and a second plurality of tie bars connects the plurality of leads to the corrugated saw street.

18. The lead frame strip of claim 17, wherein adjacent ones of the first plurality of grooves are evenly spaced and adjacent ones of the second plurality of grooves are evenly spaced.

19. The lead frame strip of claim 17, wherein the first plurality of grooves do not align with the second plurality of grooves in a vertical direction, the vertical direction being perpendicular to a plane along a length of the lead frame strip.

20. The lead frame strip of claim 17, wherein the lead frame strip includes copper or a copper alloy.

21. The lead frame strip of claim 17, further comprising a lead frame strip support tape, wherein the opposite second surface is attached to the lead frame strip support tape.

* * * * *